(12) United States Patent
Dudeck et al.

(10) Patent No.: US 8,125,842 B2
(45) Date of Patent: Feb. 28, 2012

(54) TRACKING CIRCUIT FOR REDUCING FAULTS IN A MEMORY

(75) Inventors: Dennis E. Dudeck, Hazleton, PA (US); Donald Albert Evans, Lancaster, OH (US); Hai Quang Pham, Hatfield, PA (US); Wayne E. Werner, Coopersburg, PA (US); Ronald James Wozniak, Whitehall, PA (US)

(73) Assignee: Agere Systems Inc., Allentown, PA (US)

( * ) Notice: Subject to any disclaimer, the term of this patent is extended or adjusted under 35 U.S.C. 154(b) by 367 days.

(21) Appl. No.: 12/415,248

(22) Filed: Mar. 31, 2009

(65) Prior Publication Data

US 2010/0246293 A1    Sep. 30, 2010

(51) Int. Cl.
*G11C 7/00* (2006.01)
(52) U.S. Cl. ............. 365/194; 365/189.15; 365/203; 365/204; 365/195; 365/211; 365/233.17
(58) Field of Classification Search ............. 365/189.15, 365/203, 204, 194, 195, 211, 233.17
See application file for complete search history.

(56) References Cited

U.S. PATENT DOCUMENTS

| | | | |
|---|---|---|---|
| 2003/0021154 A1* | 1/2003 | Lee | 365/185.18 |
| 2006/0104141 A1* | 5/2006 | Jo | 365/222 |
| 2007/0147158 A1* | 6/2007 | Hsu et al. | 365/227 |
| 2008/0291763 A1* | 11/2008 | Mori et al. | 365/203 |
| 2010/0054057 A1* | 3/2010 | Meterelliyoz et al. | 365/194 |

* cited by examiner

*Primary Examiner* — Fernando Hidalgo
(74) *Attorney, Agent, or Firm* — Ryan, Mason & Lewis, LLP

(57) ABSTRACT

A memory circuit includes a plurality of memory cells and a plurality of bit lines and row lines connected to the memory cells for accessing selected memory cells. The memory circuit includes a programmable voltage source adapted for connection to at least one bit line and operative to precharge the bit line to a prescribed voltage level prior to accessing a selected one of the memory cells coupled to the bit line. A control circuit coupled to the bit line is operative to oppose discharge of the bit line during at least a portion of a given memory read cycle. A tracking circuit connected to the control circuit is operative to control a delay in activation of the control circuit and/or a duration of time the control circuit is active as a function of a parameter affecting signal development time of a data signal on the bit line.

21 Claims, 4 Drawing Sheets

100

500

600

TRACKING CIRCUIT FOR REDUCING FAULTS IN A MEMORY

FIELD OF THE INVENTION

The present invention relates generally to the electrical, electronic, and computer arts, and more particularly relates to memory circuits.

BACKGROUND OF THE INVENTION

Single-ended sensing techniques are used in many circuit applications for both memory and logic. Standard memory arrays include a plurality of row lines, often arranged horizontally, a plurality of bit lines, often arranged vertically orientation (e.g., in columns), and a plurality of memory cells, each memory cell being coupled to a unique pair of row and bit lines. A first subset of the memory cells are typically connected to a common row line. Likewise, a second subset of the memory cells, which may include memory cells from the first subset, are typically connected to a common bit line. When a given row line is activated, data states within the memory cells connected to the row line are coupled to the corresponding bit lines; typically, only one memory cell is coupled to its corresponding bit line at a given time.

A bit line is typically shared by a number of memory cells and other circuit elements. The number of memory cells and circuit elements connected to a bit line significantly influences the time it takes for a single memory cell to charge or discharge the bit line, as is required during a read operation. In many cases, the bit line in a memory array is precharged to a power supply voltage of the memory array, which may be VDD, or an alternative voltage level indicative of a logic "1" data state. Alternately, the bit line may be precharged to ground or VSS, or an alternative voltage level indicative of a logic "0" data state. During a read operation of a memory array with the bit line precharged to a logic "1" state, after the bit line is precharged, a programmed logic "0" memory cell actively pulls down the bit line, while a programmed logic "1" memory cell does not drive the bit line down, so that the bit line remains substantially at the precharge voltage level. The resulting voltage level on the bit line can be sensed by a sense amplifier, for example, an inverter. The time it takes for the bit line voltage to reach a switching point of the sense amplifier, when sensing a logic "0" data state, defines the local bit line access time.

Unfortunately, leakage current from the memory cells and/or other circuit elements connected to the bit lines can at least partially discharge the bit lines. When the voltage level of a given bit line has been discharged to below the switching point of the sense amplifier as a result of leakage current, an erroneous logic "0" state will be read. Variations in process, voltage and/or temperature (PVT) conditions to which the memory array is subjected can increase the leakage current, and thereby further exacerbate the logic "0" read error condition in the memory array.

SUMMARY OF THE INVENTION

Illustrative embodiments of the present invention provide techniques for advantageously reducing certain timing delay faults, incorrect data faults, and/or leakage current related faults which may occur when reading memory cells in a memory circuit. To accomplish this, embodiments of the invention include means for supplying a prescribed amount of current to a bit line corresponding to a selected memory cell for supplementing current lost on the bit line through leakage or other mechanisms. Embodiments of the invention accomplish fault prevention by delaying application of the supplemental current to the bit line for a prescribed period of time. The prescribed period of time is beneficially controlled as a function of a signal development time on the bit line of data stored within the selected memory cell so as to track variations in PVT conditions. The delay, according to embodiments of the invention, is inversely proportional to the leakage current attributable to the memory cells. The invention is advantageous not only in preventing faults, but in reducing read access times and increasing the voltage range over which the memory circuit is capable of correctly operating.

In accordance with one aspect of the invention, a memory circuit is provided which is adapted for reducing read errors. The memory circuit includes a plurality of memory cells and a plurality of bit lines and row lines connected to the memory cells for selectively accessing the memory cells. The memory circuit includes a programmable voltage source adapted for connection to at least one bit line and operative to precharge the bit line to a prescribed voltage level prior to accessing a selected one of the memory cells coupled to the bit line. A control circuit coupled to the bit line is operative to oppose discharge of the bit line during at least a portion of a given memory read cycle. A tracking circuit connected to the control circuit is operative to control a delay in activation of the control circuit and/or a duration of time the control circuit is active as a function of a parameter affecting signal development time on the bit line of a data signal indicative of data stored in the selected memory cell.

In accordance with another aspect of the invention, an electronic system includes at least one integrated circuit comprising at least one memory circuit. The memory circuit includes a plurality of memory cells and a plurality of bit lines and row lines connected to the memory cells for selectively accessing the memory cells. The memory circuit includes a programmable voltage source adapted for connection to at least one bit line and operative to precharge the bit line to a prescribed voltage level prior to accessing a selected one of the memory cells coupled to the bit line. A control circuit coupled to the bit line is operative to oppose discharge of the bit line during at least a portion of a given memory read cycle. A tracking circuit connected to the control circuit is operative to control a delay in activation of the control circuit and/or a duration of time the control circuit is active as a function of a parameter affecting signal development time on the bit line of a data signal indicative of data stored in the selected memory cell.

In accordance with another aspect of the invention, a method for reducing faults in a memory circuit during at least a portion of a given memory read cycle includes the steps of: precharging at least one of the bit lines to a prescribed voltage level; accessing a selected one of the memory cells in the memory circuit corresponding to the at least one bit line during at least a portion of a memory read cycle; maintaining the at least one bit line substantially at the prescribed voltage level by opposing discharge of the at least one bit line during at least a portion of the memory read cycle; and controlling a delay in activation of a control circuit operative to maintain the at least one bit line substantially at the prescribed voltage level and controlling a duration of time the control circuit is active as a function of at least one parameter affecting a signal development time on the at least one bit line of a data signal indicative of data stored in the selected one of the memory cells over at least one of process, voltage and temperature variations to which the memory circuit is subjected.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only, and without limitation, wherein like reference numerals indicate similar elements throughout the several views of the drawings, and wherein.

DETAILED DESCRIPTION OF THE INVENTION

Figure 1:
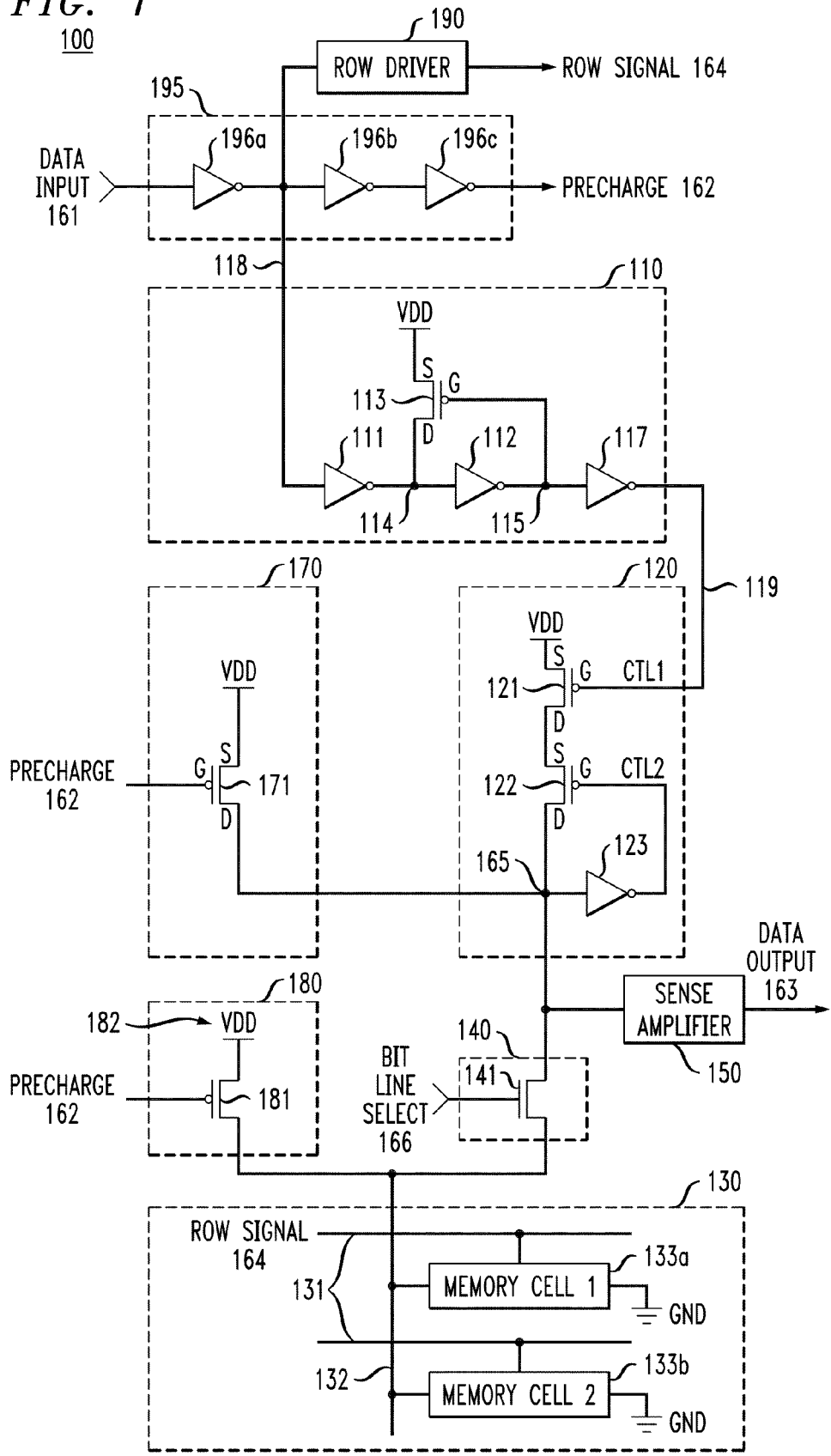
FIG. 1 is a schematic diagram depicting an exemplary memory circuit, according to an embodiment of the present invention.

The present invention will be described herein in the context of illustrative embodiments of a memory circuit and method for accessing a memory cell in a memory circuit. It is to be appreciated, however, that the techniques of the present invention are not limited to the specific circuits and method shown and described herein. Rather, embodiments of the invention are directed broadly to improved techniques for accessing and for sensing data in a memory circuit. For this reason, numerous modifications can be made to the embodiments shown and the results will still be within the scope of the invention. No limitations with respect to the specific embodiments described herein are intended or should be inferred.

Although implementations of the present invention may be described herein with specific reference to n-channel metal-oxide-semiconductor (NMOS) transistors devices and p-channel metal-oxide-semiconductor (PMOS) transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

As previously stated, there is typically a plurality of memory cells coupled to a given bit line in a memory circuit. Only one memory cell coupled to the bit line is selected for access during any given memory read cycle. The selected memory cell is accessed by activation of a corresponding row line coupled to the selected memory cell. Other unselected memory cells connected to the common bit line remain deactivated during the memory read cycle. Row lines coupled to the unselected memory cells corresponding to the given bit line are typically not activated during the memory read cycle. When reading a logic "1" data state from a selected memory cell, after the bit line has been precharged, the unselected memory cells and/or other circuit elements connected to the bit line may conduct a leakage current which effectively removes charge from the bit line, thereby decreasing the voltage level on the bit line and undesirably degrading the noise margin of the read operation.

If, as a result of the leakage current of the unselected memory cells and/or other circuit elements connected to the bit line, enough charge is removed from the bit line, the voltage level on the bit line may fall below a switching threshold of a sense amplifier coupled to the bit line for reading the state of the memory cell. In this instance, the sense amplifier may erroneously read a logic "0" data state in place of the correct logic "1" data state stored in the selected memory cell. Furthermore, the selected memory cell may also conduct leakage current and remove charge from the bit line, further contributing to the bit line logic "1" data state signal degradation.

Because there are usually substantially more unselected memory cells coupled to a bit line than the single selected memory cell, leakage current of the unselected memory cells will be the predominant factor contributing to read errors. In some types of memory cells (e.g., ROM cells), the leakage current through the single selected memory cell storing a logic "1" data state is relatively small in comparison to the leakage current through an unselected memory cell storing a logic "0" data state.

In order to reduce leakage current from the memory cells connected to a given bit line, a control circuit is preferably added to the memory circuit to actively keep the respective bit lines at or substantially near their precharge voltage levels during at least a portion of the memory read cycle. This control circuit may be referred to herein as an anti-leakage circuit or a keeper circuit. Without the keeper circuit, leakage currents of the memory cells could sufficiently discharge the corresponding bit lines to which they are connected so as to cause an incorrect read, for example, reading a logic "1" data state as a logic "0" data state, as previously explained.

A function of the keeper circuit is to oppose undesirable discharge of the bit lines, for example, due to leakage currents through memory cells coupled to the bit lines, during at least a portion of a given memory read cycle. Although the keeper circuit may be activated within all memory read cycles, it is typically only useful when reading the data state where the bit line is not being discharged by the memory cell. For instance, assuming a given bit line is precharged to a high voltage level (e.g., VDD), or an alternative voltage level indicative of a logic "1" state, the keeper circuit would be most beneficial when reading a logic "1" data state from a selected memory cell connected to the given bit line, since ideally there should be no discharging of the bit line when reading a logic "1" data state.

Due to variations in PVT conditions to which the memory circuit may be subjected, under certain PVT conditions, keeper circuits that do not track with a data-sensing time may be too strong relative to the drive strength of a memory cell storing a logic "0" data state. A keeper circuit which is too strong could excessively delay, or even prevent, the memory cell from pulling down the bit line below the switching threshold of the sense amplifier. This may result in a timing delay fault or an incorrect output logic state fault (e.g., incorrectly reading a stored logic "0" data state as a logic "1" data state), among other errors.

Alternatively, at fast process and/or high temperature conditions, a keeper circuit should be strong enough to ensure that a bit line remains substantially at or near its precharge voltage level during the appropriate portion of a memory read cycle while the signal indicative of the data state of a selected memory cell has had time to develop on the bit line, also referred to as signal development time. Signal development time is typically measured from the time the sense amplifier (SA) and selected row are turned on until there is adequate signal at the SA to determine the correct data state. However, a keeper circuit that does not track with leakage current, given manufacturing process variations, may be too weak to prevent discharging of the bit line, thereby resulting in a failure. For example, the bit line voltage could be lowered, due to cell leakage current, causing a stored logic "1" data state to be incorrectly read as a logic "0" data state.

To reduce bit line leakage, modified memory cells comprising one or more transistors having a longer channel length could be used. However, the modified memory cells should be strong enough to pull down the bit line against the keeper circuit. Furthermore, the modified memory cells occupy more area than memory cells comprising transistors with shorter channel lengths, which is undesirable. It is therefore advantageous to selectively control the strength of the keeper circuit appropriately, even under varying PVT conditions, so as reduce the effects of leakage current contributed by unselected memory cells while preventing timing delays and/or incorrect data read faults in the memory circuit.

FIG. 1 is a schematic diagram depicting an exemplary memory circuit 100, according to an embodiment of the present invention. The memory circuit 100 comprises a memory array 130 including a plurality of row lines 131, a plurality of bit lines 132 (only one of which is shown for ease of explanation), and a plurality of memory cells, 133a and 133b, each memory cell being coupled to a unique combination of a row line and a bit line so as to be individually addressable. Multiple memory cells are typically connected to a common bit line. It is to be understood that memory array 130 is not limited to the configuration shown, but rather may be arranged in alternative configurations (e.g., diagonal row lines and bit lines, etc.), in accordance with other embodiments of the invention.

Figure 2:
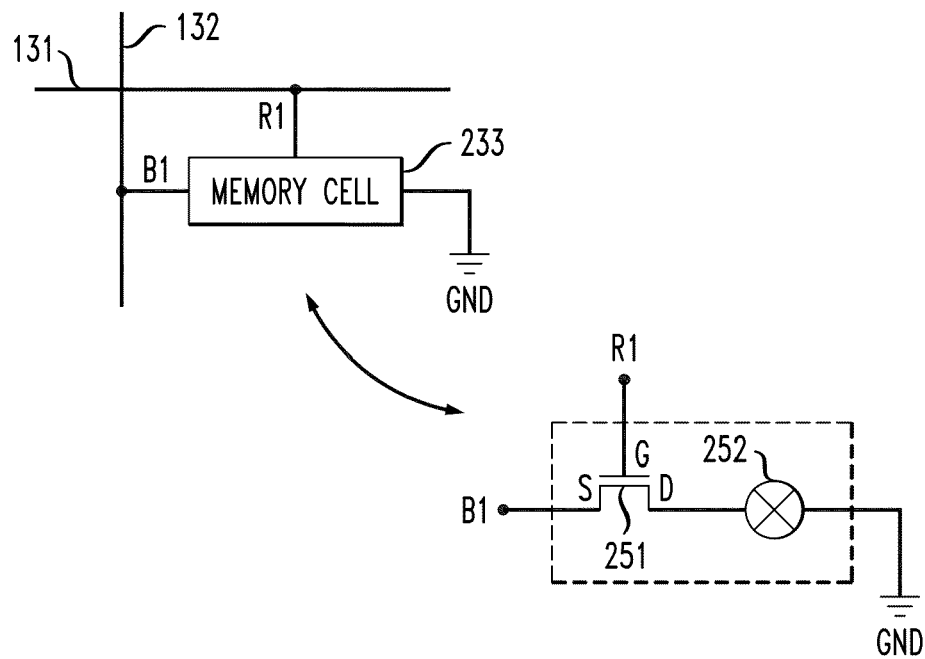
FIG. 2 is a schematic diagram depicting an exemplary memory cell suitable for use in the illustrative memory circuit shown in FIG. 1, according to an embodiment of the present invention.

FIG. 2 is a schematic diagram depicting an exemplary memory cell 233, which may be suitable for use in the illustrative memory circuit 100 of FIG. 1, according to an embodiment of the present invention. Memory cell 233 may be, for example, memory cell 133a or 133b. In this embodiment, the memory cell 233 is a read-only memory (ROM) cell, although the invention is not limited to any particular type of memory cell. Memory cell 233 comprises an NMOS access transistor device 251, or an alternative switching element (e.g., a PMOS transistor), and a programmable connection 252 coupled to the access transistor. Specifically, a first source/drain, which may be a source (S), of NMOS device 251 is adapted for connection to a corresponding bit line 132 at node B1, a second source/drain, which may be a drain (D), of device 251 is coupled to a first terminal of programmable connection 252, a gate (G) of device 251 is adapted for connection to a corresponding row line 131 at node R1, and a second terminal of the programmable connection is adapted for connection to ground, or an alternative voltage source. Alternately, the placement of the access transistor 251 and programmable connection 252 could be switched so that the access transistor 251 is coupled to ground and the programmable connection 252 is coupled to the bit line 132.

Other embodiments of the invention may comprise memory cells 233 that are other than ROM cells, such as, for example, dynamic random access memory (DRAM) cells, non-volatile memory cells, and static random access memory (SRAM) cells. Examples of non-volatile memory cells include, but are not limited to, flash memory cells, phase change memory cells, one time programmable memory cells, few times programmable memory cells, etc.

With reference again to FIG. 1, memory circuit 100 includes a bit line select circuit 140, or alternative switching circuit, coupled to the bit lines 132 and operative to select a given one of the bit lines as a function of at least one corresponding bit line select signal 166 applied to the bit line select circuit. Where there is a plurality of bit lines, as in the case of a typical memory array, bit line select circuit 140 may include a decoder circuit for selecting a given one of the bit lines as a function of multiple bit line select signals. The bit line select circuit 140 preferably comprises, for example, at least one NMOS transistor 141 having a first source/drain connected to a corresponding bit line 132, a second source/drain operatively coupled to a sense amplifier 150 for measuring the voltage level stored in a selected memory cell coupled to the bit line, and a gate adapted to receive the bit line select signal 166. Alternative bit line select circuit arrangements are similarly contemplated. Preferably, the bit line select circuit 140 includes a transistor device coupled to each bit line in the memory array 130.

Memory circuit 100 preferably includes a bit line precharge circuit 180, or alternative programmable voltage source, connected to the bit lines 132 in memory array 130. Precharge circuit 180 may be considered a programmable voltage source, not necessarily because it is operative to generate multiple voltage levels, although such an arrangement is entirely contemplated by and within the scope of the present invention, but because it is operative to selectively provide at least one voltage level as a function of a control signal supplied thereto.

In the embodiment shown, bit line precharge circuit 180 comprises a PMOS transistor 181, or alternative switch element (e.g., NMOS transistor, etc.), coupled between a corresponding bit line 132 and a precharge voltage source 182, which may be, for example, supply voltage VDD. More particularly, a first source/drain of transistor 181 is adapted for connection to VDD, a second source/drain of transistor 181 is connected to a corresponding bit line 132, and a gate of transistor 181 is adapted to receive a precharge signal 162 supplied to precharge circuit 180. Precharge circuit 180 is preferably operative to set a corresponding bit line (or bit lines) to a prescribed voltage level during periods when the bit line is otherwise inactive (e.g., between read or write operations involving the bit line). It is to be understood that the invention is not limited to the particular circuit configuration shown.

The bit lines 132 are preferably precharged to a logic high voltage level (e.g., VDD), although the bit lines may alternatively be precharged to a different voltage level (e.g., ground). Precharging the bit line to a known voltage level beneficially increases the speed of the read operation, among other advantages. In the embodiment shown, a logic low precharge signal 162 will turn on PMOS transistor 181, thereby connecting the corresponding bit line 132 to VDD and charging the bit line to a logic high voltage level.

Precharge signal 162 may be generated by a precharge signal generator circuit 195 included in memory circuit 100. Alternatively, the precharge signal 162 can be generated externally to the memory circuit 100. Precharge signal generator circuit 195 is operative to receive a data input signal 161 and to generate precharge signal 162, as an output thereof, which is a function of the input signal. As apparent from the figure, precharge signal generator circuit 195 may include one or more inverters connected together in series for buffering and/or delaying the input signal 161 to generate the precharge signal 162. More particularly, an input of a first inverter 196a is adapted to receive the input signal 161, an output of the first inverter is connected to an input of a second inverter 196b, an output of the second inverter is connected to an input of a third inverter 196c, and an output of the third inverter is adapted to generate the precharge signal 162. It is to be appreciated, however, that the precharge signal generator circuit 195 is not limited to the specific arrangement shown.

The output of first inverter 196a may be supplied to a row driver circuit 190 included in memory circuit 100. Row driver circuit 190 is preferably operative to generate a row signal 164 supplied to a corresponding row line 131 for writing data to a selected memory cell in the memory array 130. Furthermore, for driving multiple rows 131, row driver circuit 190 preferably comprises a row decoder (not explicitly shown) operative to decode a row address, which may be supplied to the row driver circuit 190 as an input thereto, for selection of one of the multiple rows 131 in memory array 130.

As previously stated, memory circuit 100 further comprises a keeper circuit 120, or alternative control circuit, operative to oppose discharge of the bit lines 132 in memory array 130 during at least a portion of a given memory read cycle, for example, as a result of leakage current primarily attributable to memory cells and/or other circuit elements connected to the bit lines. The keeper circuit 120 is preferably connected to each of the bit lines 132 in memory array 130 via the bit line select circuit 140, or an alternative connection arrangement (e.g., switch, decoder, etc.).

More particularly, keeper circuit 120 preferably comprises a first PMOS transistor device 121 and a second PMOS transistor device 122 connected in series between a keeper voltage source, which may be VDD, and the bit line select circuit 140. Specifically, a source of first PMOS device 121 is adapted for connection to VDD, a drain of PMOS device 121 is connected to a source of second PMOS device 122, a drain of PMOS device 122 is connected to the bit line select circuit 140 at node 165, a gate of PMOS device 121 is adapted for receiving a first control signal, CTL1, and a gate of PMOS device 122 is adapted for receiving a second control signal, CTL2. In the illustrative embodiment shown, the second control signal may be generated by an inverter 123 having an input connected to node 165 and an output connected to the gate of PMOS device 122. Inverter 123 functions to turn on PMOS device 122 as long as node 165 is at a logic high level and to turn off PMOS device 122 when node 165 is at a logic low level. Inverter 123 buffers node 165 from adverse effects of loading and additionally provide a more robust control signal. Inverter 123 may even function as the sense amplifier, according to other embodiments of the invention, in which case separate sense amplifier 150 may be omitted. The keeper voltage source is preferably at or substantially near the same level as the precharge voltage source 182, although the invention is not limited to any particular voltage level(s) for the precharge and keeper voltage sources.

Sense amplifier 150 is preferably coupled to the keeper circuit 120. More particularly, an input of the sense amplifier 150 is connected to node 165. In an alternative embodiment, the input of sense amplifier 150 may be coupled to the output of inverter 123. An output of the sense amplifier 150 provides the data output signal 163 which is indicative of the logic state read from a selected one of the memory cells in memory array 130. Sense amplifier 150, in practice, preferably comprises a plurality of sense amplifier circuits, one for each of the bit lines in the memory array 130. In an alternative embodiment (not explicitly shown), inverter 123 is adapted to function as a sense amplifier, and therefore a separate sense amplifier (e.g., sense amplifier 150) is not required. In this alternative embodiment, the data output signal 163 is generated directly by inverter 123.

With regard to the operation of the keeper circuit 120, when the first and second control signals supplied to the gates of PMOS devices 121 and 122, respectively, are at a logic low level (e.g., 0 volt), both the first and second PMOS devices 121, 122 will be turned on, thereby connecting node 165 to VDD. When either or both of the first and second control signals are at a logic high level (e.g., VDD), at least one of the corresponding PMOS devices 121, 122 will be turned off, and therefore electrical connection between VDD and node 165 will be opened. First and second PMOS devices 121 and 122, respectively, are thus configured using a logical AND functionality, since both PMOS devices must be turned on for the connection to be formed.

Node 165 is preferably selectively pulled up to VDD, or an alternative voltage source, through a keeper precharge circuit 170 as a function of precharge signal 162, or another control signal. Like precharge circuit 180 previously described, keeper precharge circuit 170 may be thought of more broadly as a programmable voltage source, not necessarily because it is operative to generate multiple voltage levels, although such a circuit arrangement is within the scope of the present invention, but because it is operative to selectively provide at least one voltage level (e.g., 0 or VDD) as a function of a control signal supplied thereto. Precharge circuit 170 is preferably active during a standby period, such as when the memory circuit 100 is not operative in a memory read or write cycle. In the illustrative embodiment shown, precharge circuit 170 comprises a PMOS transistor device 171 having a source adapted for connection to VDD, a drain connected to node 165, and gate adapted for receiving the precharge signal 162. Other circuit arrangements for precharge circuit 170 are similarly contemplated. Furthermore, although keeper precharge circuit 170 and keeper circuit 120 are depicted as separate functional blocks, at least a portion of the keeper precharge circuit may be integrated within the keeper circuit.

During an active phase of the memory read cycle, precharge signal 162 will be a logic high ("1") level (e.g., VDD), thereby turning off PMOS device 171. During a programmed "1" read operation, a selected bit line can decrease to a weak logic low ("0") level due, at least in part, to leakage from memory cells and/or other circuit elements connected to the selected bit line, as previously explained. The two series-connected PMOS devices 121, 122 are used to prevent node 165 from being pulled to a logic "0" level through NMOS device 141, which is coupled to the selected bit line. Conversely, if the PMOS devices 121 and 122 are too strong and a selected programmed "0" memory cell is too weak, for example as a result of certain PVT variations to which the memory cell is subjected, the memory cell will not be able to pull down the corresponding bit line fast enough during at least a portion of the memory read cycle (e.g., during an evaluate or signal development phase of the memory read cycle), and therefore a read error can result (e.g., incorrectly reading a logic "1" for the selected memory cell).

In order to reduce the likelihood of such an occurrence, the first control signal CTL1 supplied to PMOS device 121 in keeper circuit 120 is preferably adjusted to track IC manufacturing process and/or temperature variations to which the memory circuit 100 may be subjected. To accomplish this, the first control signal CTL1 is generated by a tracking circuit 110, or alternative signal generator, which advantageously controls the level of the first control signal as a function of at least IC process and/or temperature.

Tracking circuit 110 preferably comprises first, second and third inverters 111, 112 and 117, respectively, connected together in series. Specifically, an input of first inverter 111 is adapted for receiving an input signal, which is indicative of data input signal 161, conveyed by connection 118, an output of the first inverter is connected to an input of second inverter 112 at node 114, an output of the second inverter is connected to an input of third inverter 117 at node 115, and an output of the third inverter is adapted for generating the first control signal CTL1 conveyed by connection 119. It is to be understood that although three inverters are shown, the tracking circuit 110 is not limited to any particular number of inverters, and may include less than three inverters (e.g., two) or more than three inverters (e.g., four) connected in a similar manner.

Figure 3:
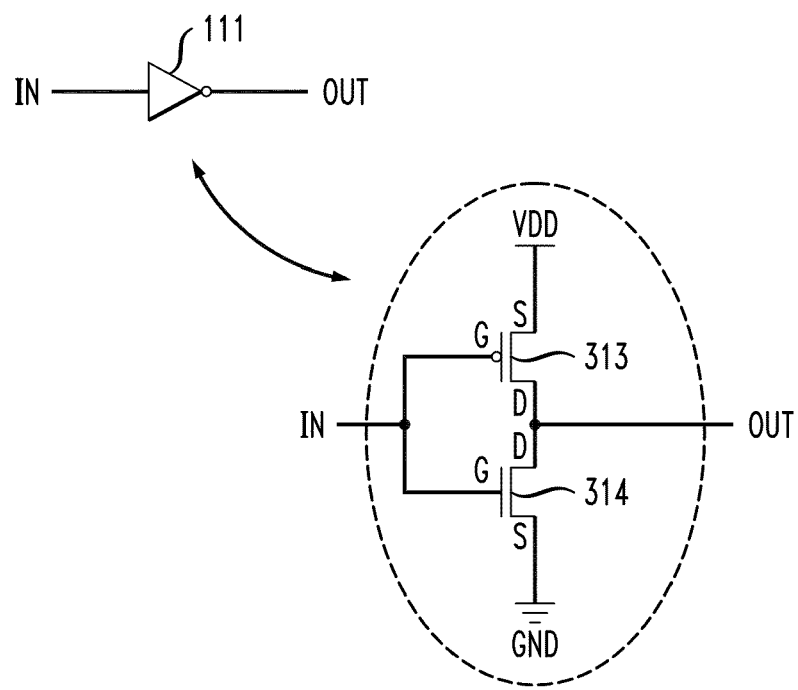
FIG. 3 is a schematic diagram depicting an exemplary inverter suitable for use in the illustrative memory circuit shown in FIG. 1, according to an embodiment of the present invention.

FIG. 3 is a schematic diagram depicting an exemplary implementation of an inverter, which may be inverter 111 shown in FIG. 1. The illustrative inverter implementation may similarly be used for forming one or more other inverters in the memory circuit 100 (e.g., inverters 112, 117, 123, etc.). Inverter 111 preferably comprises a PMOS transistor device 313 and an NMOS transistor device 314 connected together in series. Specifically, a source of PMOS 313 is adapted for connection to VDD, or an alternative voltage source, a drain of PMOS 313 is connected to a drain of NMOS 314 and forms an output (OUT) of the inverter 111, a source of NMOS 314 is adapted for connection to ground, or an alternative voltage return, and gates of PMOS 313 and NMOS 314 are connected together and form an input (IN) of the inverter.

With continued reference to FIG. 1, the tracking circuit 110 further includes a PMOS transistor device 113 having a source adapted for connection to VDD, or an alternative voltage source, a drain connected to node 114, and a gate connected to node 115. Assuming second inverter 112 is substantially matched to inverter 123, and PMOS device 113 is substantially matched to PMOS device 122, at least in terms of operating characteristics, the first control signal CTL1 generated by tracking circuit 110 will closely track variations in PVT conditions so as to ensure proper operation of the keeper circuit 120.

For ease of explanation, a single keeper circuit 120 and a single tracking circuit 110 is shown. However, in practice, for a memory array 130 having multiple bit lines, memory circuit 100 will preferably include a plurality of corresponding bit line select circuits, each bit line select circuit being coupled to a corresponding keeper node 165, keeper circuit 120, and keeper precharge circuit 170. Each keeper circuit 120 is coupled to a corresponding sense amplifier 150. According to another embodiment of the invention, a single tracking circuit 110 is coupled to a plurality of keeper circuits 120, while in accordance with yet another embodiment, memory circuit 100 includes multiple tracking circuits (tracking circuit 100 being indicative thereof), each keeper circuit 120 being coupled to a corresponding one of the tracking circuits. Furthermore, although tracking circuit 110 and keeper circuit 120 are depicted as separate functional blocks, at least a portion of the tracking circuit may be integrated within the keeper circuit.

Operation of the memory circuit 100 will be described in further detail with reference to FIG. 4, which is a timing diagram 400 illustrating an exemplary memory read cycle 401, according to an embodiment of the present invention. Timing diagram 400 graphically depicts an input signal 410, which may be representative of input signal 161 shown in FIG. 1, a row signal 420, which may be representative of row signal 164 shown in FIG. 1, and a precharge signal 430, which may be representative of precharge signal 162 shown in FIG. 1, during the memory read cycle 401, according to an embodiment of the invention.

Memory read cycle 401 preferably comprises a first portion, which may be defined herein as a precharge phase 440, and a second portion, which may be defined herein as an active phase 450. The precharge phase 440 is defined herein as the portion of the memory read cycle 401 between times t0 and t1. The active phase 450 is defined herein as the portion of the memory read cycle 401 between times t1 and t3. The active phase 450 of the memory read cycle 401 may be further divided into at least a first part 451 and a second part 453. The first part 451 of the active phase 450 is defined herein as the portion of the memory read cycle 401 between times t1 and t2. The second part 453 of the active phase 450 is defined herein as the portion of the memory read cycle 401 between time t2 and t3. It is to be understood that the memory read cycle 401 is not limited to the specific divisions shown.

During the precharge phase 440, a selected bit line (e.g., bit line 132 shown in FIG. 1) is precharged to a prescribed voltage level (e.g., VDD), such as by a bit line precharge circuit (e.g., bit line precharge circuit 180 in FIG. 1). With reference to memory circuit 100 shown in FIG. 1, during the precharge phase 440, keeper node 165 is preferably precharged to a prescribed voltage level (e.g., VDD), such as by keeper precharge circuit 170. The prescribed voltage level to which the keeper node 165 is precharged is preferably substantially the same as the voltage level to which the selected bit line is precharged. During the active phase 450, a selected row line 131 in memory array 130 is activated, and a signal from a selected memory cell (e.g., 133a) develops on the corresponding bit line 132. The signal developed on bit line 132 is then sensed by sense amplifier 150 to generate the data output signal 163 which is indicative of the sensed signal. During the first part 451 of the active phase 450 of the memory read cycle 401, the keeper circuit 120 is not activated and therefore does not supply any appreciable current to the keeper node 165. During the second part 453 of the active phase 450, the keeper circuit 120 may be activated and therefore may supply substantial current to the keeper node 165.

Input signal 410 transitioning from logic high ("1") to logic low ("0") causes row signal 420 and precharge signal 430 to transition from low to high. Row signal 430, being a logical inversion of input signal 410, transitions from low to high a first delay time 460 after the transition of the input signal 410 from high to low. This first delay time 460 will be a function of the delay through inverter 196a in memory circuit 100 of FIG. 1. The first delay time 460 may also be a function of delay within the row driver circuit 190. Due to the additional inverters (e.g., inverters 196b, 196c) in precharge signal generator circuit 195, precharge signal 430 transitions from low to high a second delay time after the transition of the input signal 410 from high to low. For simplicity, the second delay time is shown as being substantially equal to the first delay time 460, although there will typically be some measurable difference between the first and second delay times.

Input signal 161, of which Input signal 410 is representative, propagates through inverter 196a to the input of the tracking circuit 110 via connection 118. Without PMOS transistor 113, input signal 161 would continue to propagate directly through the tracking circuit 110, being further delayed by the nominal delays associated with the inverters 111, 112 and 113. However, this embodiment of the memory circuit 100 is configured such that PMOS transistor 113 opposes the pull-down of node 114 by the NMOS transistor 314 (see FIG. 3) in inverter 111. A result of the opposition of PMOS transistor 113 against the pull-down of node 114 by NMOS transistor 314 is a delay of the high-to-low transition of node 114, thereby delaying the high-to-low transition of the first control signal CTL1 generated by tracking circuit 110. The stronger transistor 113 is, or the weaker transistor 314 is, the greater the opposition is to the pull-down of node 114, and thus the greater the delay of the high-to-low transition of the first control signal CTL1. Conversely, the weaker transistor 113 is, or the stronger transistor 314 is, the less the opposition is to the pull-down of node 114, and thus the less the delay of the high-to-low transition of the first control signal CTL1. Therefore, the delay through the tracking circuit 110, as measured from the input of the tracking circuit at connection 118 to the output of the tracking circuit at connection 119, will be a function of the relative strength of PMOS transistor 113 to NMOS transistor 314 in inverter 111.

Within the memory circuit 100, the relative strength of substantially all PMOS transistors will substantially track each other. The tracking of the strengths of the PMOS transistors is due primarily to common variations in process parameters relating to PMOS transistor strength. The variations are, to a large extent, common to all PMOS transistors within memory circuit 100. Likewise, the relative strength of substantially all NMOS transistors will substantially track each other. The tracking of the strengths of the NMOS transistors is due primarily to common variations in process parameters relating to NMOS transistor strength. The variations are, to a large extent, common to all NMOS transistors within memory circuit 100. Process variations that are related to either PMOS or NMOS transistor strengths include, for example, variations in gate oxide thickness, channel impurity dopings, source/drain impurity dopings, threshold voltage, channel width, and channel length.

Furthermore, variations in temperature and voltage (e.g., supply voltage) will affect PMOS and NMOS transistor strength. The effects of temperature and/or voltage upon substantially all PMOS transistors will track. Similarly, the effects of temperature and/or voltage upon substantially all NMOS transistors will track. However, the effects of temperature and/or voltage on PMOS transistors may be different (e.g., in terms of magnitude, etc.) than on NMOS transistors.

Because of the tracking of transistor strength among PMOS transistors and among NMOS transistors, the delay through the adjustment circuit 110, from the input to the output of the tracking circuit 110, will be a function of (e.g., proportional) to the relative strength of the PMOS transistors to the NMOS transistors. In particular, the strength of the NMOS access transistor (e.g., NMOS transistor 251 in FIG. 2) is significant and tracks with the strength of NMOS transistor 314 (see FIG. 3) in inverter 111. Therefore, the delay through tracking circuit 110, from the input to the output thereof, will be a function of the relative strength of the PMOS transistors, including PMOS transistor 113, to the NMOS transistors, including the NMOS access transistors (e.g., 251 in FIG. 2) in each of the memory cells 133a, 133b.

Input signal 410 propagates through inverter 196a in precharge signal generator circuit 195 and through tracking circuit 110 to generate first control signal CTL1 which is essentially a delayed version of data input signal 161. The first control signal CTL1 is supplied to the gate of first PMOS transistor 121 in keeper circuit 120. The high-to-low transition of the first control signal CTL1 turns on PMOS transistor 121 enabling current to flow through keeper circuit 120 to the keeper node 165, thereby activating the keeper circuit. Note, that keeper node 165 has been precharged to a high voltage level (e.g., VDD) prior to CTL1 going low. Thus, prior to a "0" data state signal development on the selected bit line, and therefore at keeper node 165, and when reading a "1" data state, the second control signal CTL2 generated by inverter 123 will be low. The second control signal CTL2 being low, which is supplied to the gate of PMOS transistor 122, will turn on transistor 122.

Figure 4:
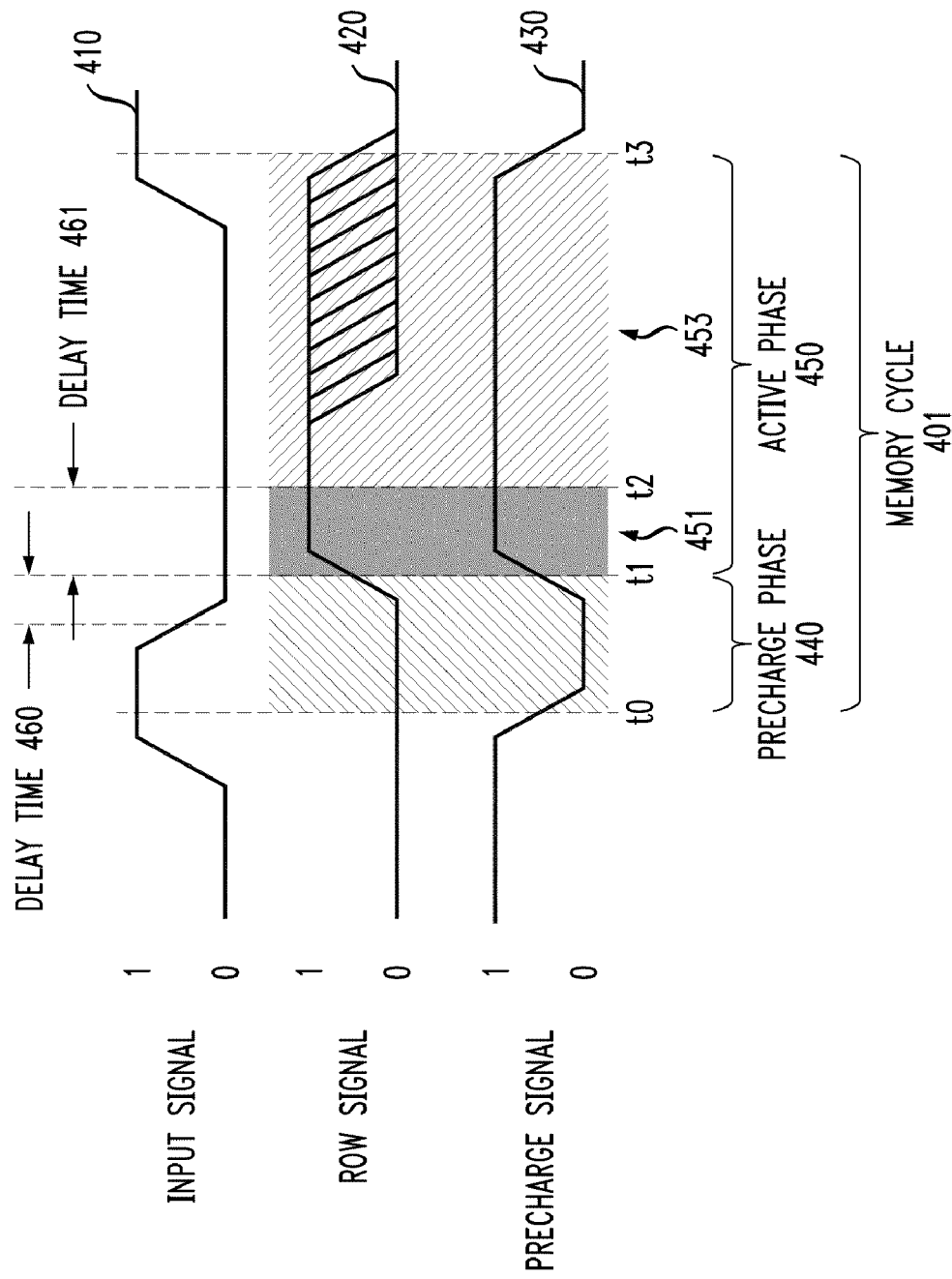
FIG. 4 is a timing diagram illustrating an exemplary memory read cycle, according to an embodiment of the present invention.

Due primarily to the delay through tracking circuit 110, keeper circuit 120 may not be activated until after the selected row line 131 has been activated; that is, after row signal 420 transitions from low to high, as shown in the timing diagram 400 of FIG. 4. The signal to be read from the selected memory cell starts to develop on the corresponding bit line 132 when the corresponding row line 131 is activated. Activation of the row line 131, by assertion of the corresponding row signal 164, turns on the access transistor 251 in the selected memory cell. Thus, as shown in FIG. 4, there is a delay from the time the row line is activated, and from when the signal starts to develop on the corresponding bit line, to when the keeper circuit 120 is activated. The first part 451 of the active phase 450 of memory read cycle 401 comprises the delay from when the row line 131 is activated and from when the signal starts to develop on the bit line 132, to when the keeper circuit 120 is activated.

The second part 453 of the active phase 450 of memory read cycle 401 starts, and the first part 451 ends, at time t2, when the first control signal CTL1, which is a delayed version of input signal 410, is activated; that is, when control signal CTL1 transitions from high to low, thereby turning on PMOS transistor 121. The second part 453 of the active phase 450 terminates at time t3, following the transitioning of input signal 410 from low to high. During the second part 453, PMOS transistor 121 is turned on; that is, PMOS transistor 121 is conductive. In an alternate embodiment, PMOS transistor 121 is turned off and keeper circuit 120 is deactivated prior to the end of the active phase 450.

If the signal developed on the bit line 132 corresponds to a "1" data state stored in the selected memory cell 133a, second control signal CTL2 will be low and hence PMOS transistor 122 will also be on; that is, PMOS transistor 122 will be conductive. In this instance, keeper circuit 120 will be activated, thereby enabling replacement current to flow from VDD, or an alternative voltage source, to keeper node 165. The current supplied to keeper node 165 replaces charge removed from the keeper node, as a result of leakage or otherwise, and replaces, through bit line select circuit 140, charge removed from the bit line 132. As stated above, leakage current may be attributable to leakage through the first memory cell 133a, the second memory cell 133b, and through any other leakage path, for example, through a bit line junction leakage path, or through junction or gate oxide leakage of NMOS transistor 141 in bit line select circuit 140, the PMOS transistor 181 in precharge circuit 180, or through PMOS transistor 171 in keeper node precharge circuit 170.

If the signal developed on the bit line 132 corresponds to a "0" data state stored in the selected memory cell 133a and has propagated to keeper node 165, second control signal CTL2 will be high, thereby turning off PMOS transistor 122; that is, PMOS transistor 122 will not be conductive. In this instance, keeper circuit 120 will not be activated and will therefore not enable replacement current to flow from VDD to keeper node 165. Keeper circuit 120 being deactivated (i.e., off) allows, without hindrance by the keeper circuit, a "0" data state signal development on the corresponding bit line 132 and on keeper node 165.

In contrast, if keeper circuit 120 were to be activated substantially at the same time as the row line 131 is activated, a "0" data state signal development on keeper node 165 and on the corresponding bit line 132 would be hindered by replacement current flowing through the keeper circuit. Tracking circuit 110 ensures, at least for some combination of process, voltage and/or temperature conditions to which memory circuit 100 may be subjected, that keeper circuit 120 is not activated substantially at the same time as activation of the row line 131 and allows for a "0" data state signal development on the corresponding bit line 131 and on keeper node 165 without substantial hindrance.

Because the delay through tracking circuit 110, from the input to the output thereof, is a function of the relative strength of the PMOS transistors to the NMOS access transistor 251 in each of the memory cells, the stronger the access transistor 251, the shorter the delay and thus the sooner the keeper circuit 120 is activated; that is, the first part 451 of active phase 450 terminates sooner, and the second part 453 starts sooner. Generally, the stronger the NMOS access transistor 251 in a given memory cell (e.g., 133a), the more the access transistor leaks current between its drain and source when the transistor is in the off state, and consequently the more the memory cell leaks charge off of the corresponding bit line 132. Furthermore, the stronger the access transistor 251, the sooner the given memory cell data state signal is developed on the corresponding bit line 132. The shorter delay associated with the stronger access transistor 251 provides replacement current sooner to counteract the leakage current through unselected second memory cells (e.g., 133b), which are off, or through the selected memory cell, which is on, without substantially inhibiting signal development on the bit line 132 or on the keeper node 165.

Similarly, because the delay through tracking circuit 110 is a function of the relative strength of the PMOS transistors to the NMOS access transistor 251 in the memory cells, as previously explained, the weaker the access transistor, the longer the delay and thus the later the keeper circuit 120 is activated; that is, the first part 451 of active phase 450 terminates later, and the second part 453 starts later. Generally, the weaker the access transistor 251 in a given memory cell, the less the access transistor leaks current between its drain and source when in the off state, and consequently the less the memory cell leaks charge off of the bit line 132. Furthermore, the weaker the access transistor 251, the later the given memory cell data state signal is developed on the corresponding bit line 132. The longer delay associated with the weaker access transistor 251 provides more time for signal development to occur on the corresponding bit line 132 and on the keeper node 165 without allowing substantial leakage of charge from the bit line or the keeper node.

Figure 5:
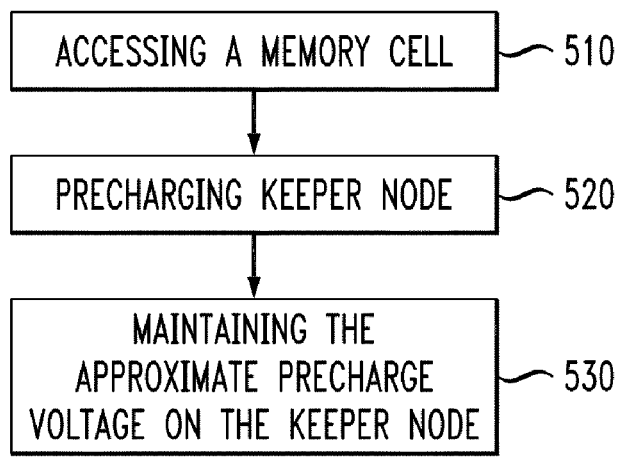
FIG. 5 is a logical flow diagram depicting an exemplary method of accessing a memory cell, in accordance with an embodiment of the present invention.

FIG. 5 is a logical flow diagram depicting an exemplary method 500 of accessing a memory cell in a memory circuit in a manner which reduces faults in the memory circuit, in accordance with an embodiment of the present invention. The memory circuit preferably comprises memory circuit 100 described in FIGS. 1 through 4. Method 500 assumes that the bit lines in the memory circuit are precharged to a prescribed voltage level (e.g., VDD) prior to accessing the memory cells, such as during an inactive period of the memory circuit (e.g., when the memory circuit is not in a read or write cycle).

With reference to FIG. 5, in step 510 of method 500, a selected memory cell is accessed, for example, memory cell 133a in FIG. 1. Once the memory cell is accessed, a signal indicative of the data stored within the memory cell begins to develop on the bit line corresponding to the memory cell. For example, if the stored data state is a logic "0," the bit line (which is precharged high) will begin to discharge substantially to zero. If the stored data state is a logic "1," the bit line should remain at the precharged voltage level. In step 520, the keeper node, for example, node 165 in FIG. 1, is precharged to a prescribed voltage level, for example, VDD. The prescribed voltage level to which the keeper node is charged is preferably substantially equal to the voltage level to which the bit lines are precharged prior to accessing the memory cell.

In step 530, the keeper node is maintained at substantially the prescribed precharge voltage level, for a time after terminating the precharge operation. As previously described, the approximate precharge voltage level is preferably maintained on the keeper node 165 using keeper circuit 120 in conjunction with tracking circuit 110 (see FIG. 1). The keeper circuit 120 is operative to maintain the approximate precharge voltage on node 165, and tracking circuit 110 is operative to set activation of the keeper circuit as a function of a parameter that affects a signal development time on the bit line, such as, for example, the strength of the PMOS transistors relative to the strength of the NMOS access transistors in the memory cells. Details of accessing the first memory cell 133a, precharging the keeper node 165, and maintaining the approximate precharge voltage on the keeper node have been described herein above with reference to FIGS. 1 through 4.

An illustrative memory circuit according to embodiment of the present invention comprises a keeper circuit, or alternative control circuit, connected to a tracking circuit, or alternative signal generator, adapted to allow the keeper circuit to track operation of one or more memory cells corresponding to a given bit line to which the keeper circuit is coupled over variations in PVT conditions to which the memory circuit may be subjected. For example, the keeper circuit is preferably operative in a manner which enables weaker memory cells to track with a delay in activation of the keeper circuit, such that adequate time is provided for development of the data state signal corresponding to a selected memory cell. The keeper circuit is preferably further operative in a manner which enables stronger memory cells to track with earlier activation of the keeper circuit so as to counteract higher leakage currents exhibited by the stronger memory cells. In essence, techniques of the present invention overcome the skew of PMOS and NMOS transistor characteristics due to variations in PVT conditions.

Preventing undesirable discharge of the bit line by the keeper circuit enables more signal to be made available for sensing, thereby improving noise margin in the memory circuit. In addition to preventing incorrect data from being read, having more signal available for sensing beneficially increases the voltage range and the temperature range over which the memory circuit will correctly operate, reduces read access times, and increases manufacturing yield.

At least a portion of the techniques of the present invention may be implemented in one or more integrated circuits. In forming integrated circuits, die are typically fabricated in a repeated pattern on a surface of a semiconductor wafer. Individual die are cut or diced from the wafer, then packaged as integrated circuits. In packaging the dies, individual die are attached to a receiving substrate according to methods of the invention. One skilled in the art would know how to dice wafers to produce integrated circuits. Integrated circuits so manufactured are considered part of this invention.

Figure 6:
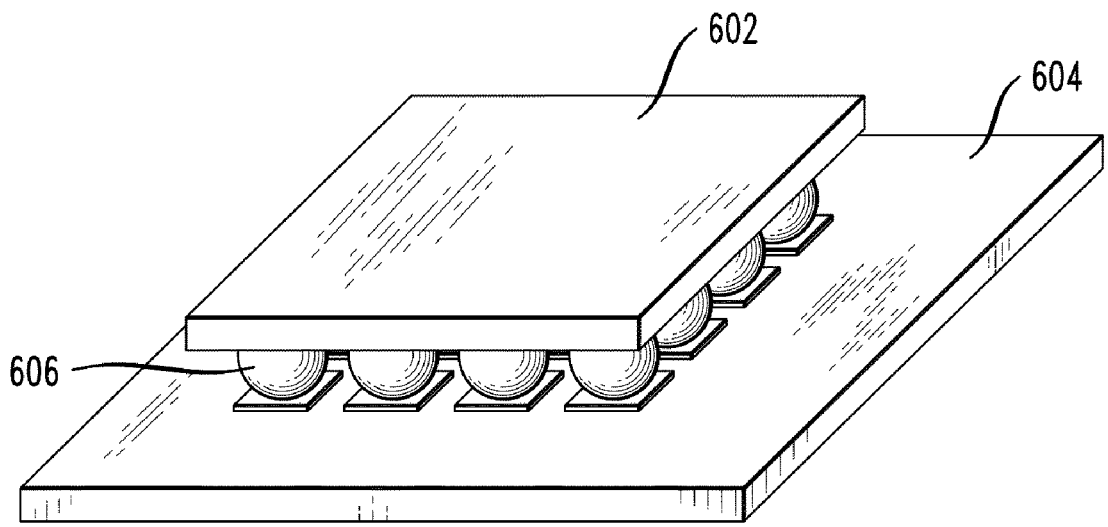
FIG. 6 is a perspective view depicting at least a portion of a semiconductor structure, according to an embodiment of the invention.

FIG. 6 is a perspective view depicting at least a portion of a semiconductor structure 600, formed according to an embodiment of the invention for implementing techniques of the present invention. The semiconductor structure 600 comprises a first integrated circuit die 602 and at least a second integrated circuit die 604 mechanically mounted proximate to and electrically interconnected with the first integrated circuit die in a known manner. An illustrative embodiment of this application includes, but is not limited to, flip-chip and multi-chip module (MCM) technology.

The means of electrical interconnection contemplated by the invention is not limited and may include, for example, utilizing solder bumps, wire bonding, etc. As shown, the interconnection means used in semiconductor structure 600 includes a plurality of solder bumps 606, or alternative conductive structures, each solder bump being formed between a bonding site on the first integrated circuit die 602 and a corresponding bonding site on the second integrated circuit die 604.

By way of example only and without loss of generality, the first integrated circuit die may include a processor (e.g., central processing unit (CPU), microprocessor, digital signal processor (DSP), etc.) and the second integrated circuit die may include memory utilized by the processor. One or more of the integrated circuit die includes a memory circuit adapted for reducing certain timing delay faults, incorrect data faults, and/or leakage current related faults which may occur when reading memory cells in a memory circuit, according to an embodiment of the invention described herein. Semiconductor structures so manufactured are also considered part of this invention.

An integrated circuit and/or semiconductor structure formed in accordance with techniques of the present invention can be employed in essentially any application and/or electronic system which utilizes memory (e.g., embedded memory). Suitable systems for implementing the invention may include, but are not limited to, personal computers, communication networks, portable communications devices (e.g., cell phones), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory circuit, comprising:
a plurality of memory cells;
a plurality of bit lines and row lines connected to the memory cells for accessing selected ones of the memory cells;
a programmable voltage source adapted for connection to at least one of the bit lines and operative to charge the at least one bit line to a prescribed voltage level prior to accessing a selected one of the memory cells coupled to the at least one bit line;
a control circuit coupled to the at least one bit line and operative to oppose discharge of the at least one bit line during at least a portion of a given memory read cycle; and
a tracking circuit connected to the control circuit and operative to control a delay in activation of the control circuit and a duration of time the control circuit is active as a function of at least one parameter affecting a signal development time of a data signal on the at least one bit line, the data signal being indicative of data stored in the selected one of the memory cells.

2. The memory circuit of claim 1, wherein the at least one parameter is affected by at least one of process, voltage and temperature variations to which the memory circuit is subjected.

3. The memory circuit of claim 1, wherein the at least one parameter comprises a leakage current from one or more of the memory cells coupled to the at least one bit line.

4. The memory circuit of claim 1, further comprising a switching circuit coupled between the at least one bit line and the control circuit, the switching circuit being operative to selectively connect the at least one bit line to the control circuit as a function of at least one control signal.

5. The memory circuit of claim 1, wherein an output of the control circuit is operative to generate a data output of the memory circuit.

6. The memory circuit of claim 1, wherein the control circuit is operative to establish a conduction path from a voltage source to a first node in the control circuit during at least a portion of the given memory read cycle when the selected memory cell is in a first data state and is operative to remove the conduction path when the selected memory cell is in a second data state, wherein the first node is coupled to the at least one bit line.

7. The memory circuit of claim 1, wherein the control circuit comprises first and second metal-oxide-semiconductor (MOS) transistors and an inverter, a first source/drain of the first MOS transistor adapted for connection to a first voltage source, a second source/drain of the first MOS transistor connected to a first source/drain of the second MOS transistor, a gate of the first MOS transistor adapted for receiving a first control signal, a second source/drain of the second MOS transistor connected to an input of the inverter at a first node, a gate of the second MOS transistor connected to an output of the inverter, wherein the first node is coupled to the at least one bit line.

8. The memory circuit of claim 1, further comprising at least one sense amplifier connected to the control circuit and operative to generate a data output of the memory circuit as a function of the data signal on the at least one bit line.

9. The memory circuit of claim 1, wherein the given memory read cycle comprises a precharge phase and an active phase, the programmable voltage source being operative to charge the at least one bit line to the prescribed voltage level during at least a portion of the precharge phase, the control circuit being operative during at least a portion of the active phase.

10. The memory circuit of claim 1, wherein the tracking circuit is operative to receive a data input signal supplied to the memory circuit and to generate a first control signal for activating the control circuit, the first control signal being delayed from the input signal by a delay time, the delay time being controlled as a function of at least one characteristic of the at least one of process, voltage and temperature variations to which the memory circuit is subjected.

11. The memory circuit of claim 10, wherein the delay time is shorter when a leakage current from one or more of the memory cells coupled to the at least one bit line is higher and wherein the delay time is longer when the leakage current is lower.

12. The memory circuit of claim 10, wherein the tracking circuit comprises a first MOS transistor of a first conductivity type and at least a first inverter, a first source/drain of the first MOS transistor adapted for connection to a voltage supply of the memory circuit, a second source/drain of the first MOS transistor connected to an input of the first inverter, and a gate of the first MOS transistor connected to an output of the first inverter, wherein the delay time is controlled as a function of at least one characteristic of the first MOS transistor relative to at least one characteristic of at least a second MOS transistor of a second conductivity type, opposite the first conductivity type, in the memory circuit.

13. The memory circuit of claim 12, wherein the delay time is controlled as a function of a strength of the first MOS transistor relative to a strength of the at least second MOS transistor.

14. The memory circuit of claim 13, wherein the delay time is shorter when the first MOS transistor is weaker with respect to the second MOS transistor, and the delay time is longer when the first MOS transistor is stronger with respect to the second MOS transistor.

15. The memory circuit of claim 10, wherein the tracking circuit comprises:
a p-channel metal-oxide-semiconductor (PMOS) transistor; and
first, second and third inverters, an input of the first inverter adapted to receive the input signal, an output of the first inverter connected to an input of the second inverter and to a first source/drain of the PMOS transistor, an output of the second inverter connected to an input of the third inverter and to a gate of the PMOS transistor, an output of the third inverter generating the first control signal, and a second source/drain of the PMOS transistor adapted for connection to a voltage supply of the memory circuit, wherein the delay time is controlled as a function of at least one characteristic of the PMOS transistor relative to at least one NMOS transistor in the memory circuit.

16. An integrated circuit including at least one embedded memory circuit, the embedded memory circuit comprising:
a plurality of memory cells;
a plurality of bit lines and row lines connected to the memory cells for accessing selected ones of the memory cells;
a programmable voltage source adapted for connection to at least one of the bit lines and operative to charge the at least one bit line to a prescribed voltage level prior to accessing a selected one of the memory cells coupled to the at least one bit line;
a control circuit coupled to the at least one bit line and operative to oppose discharge of the at least one bit line during at least a portion of a given memory read cycle; and
a tracking circuit connected to the control circuit and operative to control a delay in activation of the control circuit and a duration of time the control circuit is active as a function of at least one parameter affecting a signal development time of a data signal on the at least one bit line, the data signal being indicative of data stored in the selected one of the memory cells.

17. The integrated circuit of claim 16, wherein the control circuit is operative to establish a conduction path from a voltage source to a first node in the control circuit during at least a portion of the given memory read cycle when the selected memory cell is in a first data state and is operative to remove the conduction path when the selected memory cell is in a second data state, wherein the first node is coupled to the at least one bit line.

18. The integrated circuit of claim 16, wherein the control circuit comprises first and second MOS transistors and an inverter, a first source/drain of the first MOS transistor adapted for connection to a first voltage source, a second source/drain of the first MOS transistor connected to a first source/drain of the second MOS transistor, a gate of the first MOS transistor adapted for receiving a first control signal, a second source/drain of the second MOS transistor connected to an input of the inverter at a first node, a gate of the second MOS transistor connected to an output of the inverter, wherein the first node is coupled to the at least one bit line.

19. An electronic system, comprising:
at least one integrated circuit including at least one memory circuit, the memory circuit comprising:
a plurality of memory cells;
a plurality of bit lines and row lines connected to the memory cells for accessing selected ones of the memory cells;
a programmable voltage source adapted for connection to at least one of the bit lines and operative to charge the at least one bit line to a prescribed voltage level prior to accessing a selected one of the memory cells coupled to the at least one bit line;
a control circuit coupled to the at least one bit line and operative to oppose discharge of the at least one bit line during at least a portion of a given memory read cycle; and
a tracking circuit connected to the control circuit and operative to control a delay in activation of the control circuit and a duration of time the control circuit is active as a function of at least one parameter affecting a signal development time of a data signal on the at least one bit line, the data signal being indicative of data stored in the selected one of the memory cells.

20. A method for reducing faults in a memory circuit during at least a portion of a given memory cycle, the memory circuit including a plurality of memory cells and a plurality of bit lines and row lines connected to the memory cells for selectively accessing the memory cells, the method comprising the steps of:
precharging at least one of the bit lines to a prescribed voltage level;
accessing a selected one of the memory cells in the memory circuit corresponding to the at least one bit line during at least a portion of a memory read cycle;
maintaining the at least one bit line substantially at the prescribed voltage level by opposing discharge of the at least one bit line during at least a portion of the memory read cycle; and
controlling a delay in activation of a control circuit operative to maintain the at least one bit line at substantially the prescribed voltage level and controlling a duration of time the control circuit is active as a function of at least one parameter affecting a signal development time of a data signal on the at least one bit line, the data signal being indicative of data stored in the selected one of the memory cells.

21. A semiconductor structure, comprising:
a first integrated circuit die; and
at least a second integrated circuit die mechanically mounted proximate to and electrically interconnected with the first integrated circuit die, at least one of the first and at least second integrated circuit die including a memory circuit comprising:
a plurality of memory cells;
a plurality of bit lines and row lines connected to the memory cells for accessing selected ones of the memory cells;
a programmable voltage source adapted for connection to at least one of the bit lines and operative to charge the at least one bit line to a prescribed voltage level prior to accessing a selected one of the memory cells coupled to the at least one bit line;
a control circuit coupled to the at least one bit line and operative to oppose discharge of the at least one bit line during at least a portion of a given memory read cycle; and a tracking circuit connected to the control circuit and operative to control a delay in activation of the control circuit and a duration of time the control circuit is active as a function of at least one parameter affecting a signal development time of a data signal on the at least one bit line, the data signal being indicative of data stored in the selected one of the memory cells.

* * * * *

UNITED STATES PATENT AND TRADEMARK OFFICE
CERTIFICATE OF CORRECTION

| | | |
|---|---|---|
| PATENT NO. | : 8,125,842 B2 | Page 1 of 1 |
| APPLICATION NO. | : 12/415248 | |
| DATED | : February 28, 2012 | |
| INVENTOR(S) | : D. E. Dudeck et al. | |

It is certified that error appears in the above-identified patent and that said Letters Patent is hereby corrected as shown below:

Claim 1, col. 15, line 58, insert --at least one of (i)-- between the words "control a".

Claim 1, col. 15, line 59, insert --(ii)-- between the words "and a".

Claim 16, col. 17, line 43, insert --at least one of (i)-- between the words "a delay".

Claim 16, col. 17, line 44, insert --(ii)-- between the words "control a".

Claim 19, col. 18, line 19, insert --at least one of (i)-- between the words "a delay".

Claim 19, col. 18, line 20, insert --(ii)-- between the words "control a".

Claim 21, col. 19, line 2, insert --at least one of (i)-- between the words "a delay".

Claim 21, col. 19, line 3, insert --(ii)-- between the words "control a".

Signed and Sealed this
First Day of May, 2012

David J. Kappos
*Director of the United States Patent and Trademark Office*